US011533823B2

(12) United States Patent
Ganti et al.

(10) Patent No.: US 11,533,823 B2
(45) Date of Patent: Dec. 20, 2022

(54) MOBILE DEVICE CASE INCLUDING AN ACTIVE COOLING SYSTEM

(71) Applicant: Frore Systems Inc., San Jose, CA (US)

(72) Inventors: Suryaprakash Ganti, Los Altos, CA (US); Brian James Gally, Los Gatos, CA (US); Prabhu Sathyamurthy, San Jose, CA (US); Seshagiri Rao Madhavapeddy, La Jolla, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 17/121,607

(22) Filed: Dec. 14, 2020

(65) Prior Publication Data

US 2021/0185853 A1  Jun. 17, 2021

Related U.S. Application Data

(60) Provisional application No. 62/948,538, filed on Dec. 16, 2019.

(51) Int. Cl.
*H05K 7/20* (2006.01)
*H04B 1/3888* (2015.01)

(52) U.S. Cl.
CPC ....... *H05K 7/20136* (2013.01); *H04B 1/3888* (2013.01)

(58) Field of Classification Search
CPC .......................... H05K 7/20136; H04B 1/3888
See application file for complete search history.

(56) References Cited

U.S. PATENT DOCUMENTS

| 6,232,680 | B1 | 5/2001 | Bae |
| 10,838,462 | B1 | 11/2020 | Monaco |
| 11,119,544 | B1* | 9/2021 | Perez .................. G06F 1/203 |
| 2011/0259557 | A1* | 10/2011 | Chao .................. H01L 23/467 |
| | | | 165/121 |
| 2015/0017905 | A1 | 1/2015 | Li |
| 2016/0286921 | A1* | 10/2016 | Northrup ............... A45C 11/00 |
| 2016/0343637 | A1* | 11/2016 | Axelrod ............... H01L 23/467 |

FOREIGN PATENT DOCUMENTS

| CN | 110022384 | 7/2019 |
| EP | 3364452 | 8/2019 |

* cited by examiner

*Primary Examiner* — Mukundbhai G Patel
(74) *Attorney, Agent, or Firm* — Van Pelt, Yi & James LLP

(57) ABSTRACT

A mobile device case is described. The mobile device case includes a housing configured to retain a mobile device and an active cooling system integrated into the housing. The active cooling system configured to use vibrational motion to cool a surface of the mobile device.

22 Claims, 11 Drawing Sheets

500

500

500

MOBILE DEVICE CASE INCLUDING AN ACTIVE COOLING SYSTEM

CROSS REFERENCE TO OTHER APPLICATIONS

This application claims priority to U.S. Provisional Patent Application No. 62/948,538 entitled MOBILE DEVICE CASE INCLUDING MEMS-BASED COOLING DEVICES filed Dec. 16, 2019 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
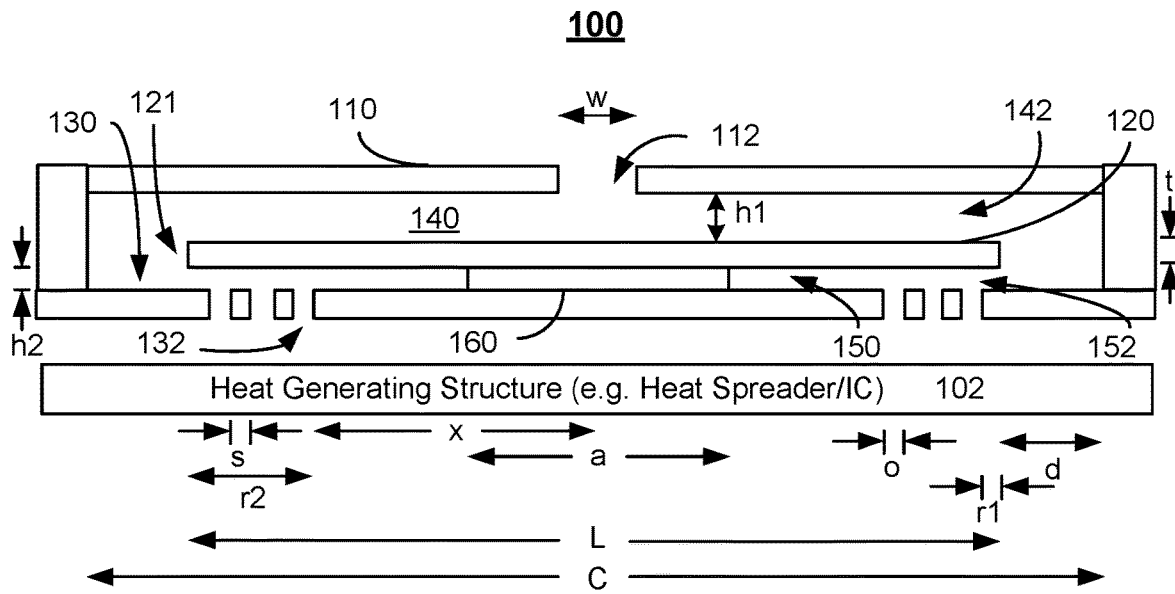
FIGS. 1A-1E depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Further, some mobile devices, such as smart phones and/or notebook computers, are desired to be used in conjunction with mobile device cases. Such mobile device cases may provide additional physical protection for the mobile device. However, mobile device cases also restrict airflow around the mobile device. As a result, the use of mobile device case may adversely affect heat dissipation from the mobile device. Stated differently, the components that generate heat in the mobile device may run hotter when the mobile device is used in conjunction with a case than when the mobile device is used alone. Thus, mechanisms for accounting for the presence of mobile device cases as well as for generally improving heat management for mobile and other devices are desired.

A mobile device case is described. The mobile device case includes a housing configured to retain a mobile device and an active cooling system integrated into the housing. The active cooling system configured to use vibrational motion to cool a surface of the mobile device. In some embodiments, the housing has a thickness not exceeding three millimeters.

The active cooling system may include a cooling element including a first side and a second side. The first side is distal to the mobile device and in communication with a fluid. The second side is proximal to the mobile device. The cooling element is configured to direct the fluid from the first side to the second side using the vibrational motion such that the fluid moves toward the surface of the mobile device. In some embodiments, the active cooling system further includes an orifice plate having orifice(s) therein. The orifice plate is between the cooling element and the mobile device. The cooling element is actuated to drive the fluid through the orifice(s). The fluid travels from the orifice(s) toward the surface of the mobile device. In some embodiments, the active cooling system further includes a support structure. The cooling element may be a centrally anchored cooling element or an edge anchored cooling element. The centrally anchored cooling element has a central region and a perimeter. The centrally anchored cooling element is supported by the support structure at the central region and has at least part of the perimeter unpinned. The edge anchored cooling element has a central portion and an edge. The edge anchored cooling element is supported by the support structure at the edge and has at least one aperture therein. The active cooling system may include a plurality of cooling cells. Each cooling cell includes the cooling element having the side and second sides. The first side is distal to the mobile device and in communication with a fluid. The second side is proximal to the mobile device. The cooling element is configured to direct the fluid from the first side to the second side using vibrational motion such that the fluid moves toward the surface of the mobile device.

In some embodiments, the housing further includes depression(s) therein. The active cooling system is configured to fit within the depression(s). The depression may have a depth not exceeding two millimeters. In some embodiments, the mobile device case further includes a connector configured to be coupled with the mobile device such that the active cooling system is energized by the mobile device. In some embodiments the mobile device case includes a battery electrically connected to the active cooling system such that the active cooling system is energized by the battery. The mobile device case may be configured to retain at least one on a mobile phone, a laptop, a tablet computer, a notebook computer, and a smart phone.

In some embodiments, a mobile device case includes a housing and an active cooling system. The housing is configured to retain a mobile device and has a thickness not exceeding three millimeters. The active cooling system is integrated into the housing and has a depth not exceeding two millimeters. The active cooling system is configured to cool a surface of the mobile device and includes a cooling element in communication with a fluid. The cooling element is configured to use vibrational motion to direct the fluid to be incident on a surface of the mobile device.

In some embodiments, a method is described. The method includes driving a cooling element of an active cooling system at a frequency to induce a vibrational motion. The active cooling system is integrated into a housing of a mobile device case. The housing is configured to retain a mobile device. In some embodiments, the housing has a thickness not exceeding three millimeters. The cooling element may include a first side and a second side. The first side is distal to the mobile device and in communication with a fluid, while the second side is proximal to the mobile device. The cooling element is configured to direct the fluid from the first side to the second side using the vibrational motion such that the fluid moves toward the surface of the mobile device.

The active cooling system may include an orifice plate having at least one orifice therein. The orifice plate is between the cooling element and the mobile device. The cooling element is actuated to drive the fluid through the at least one orifice. The fluid travels from the at least one orifice toward the surface of the mobile device. The active cooling system may further include a support structure. In such embodiments, the cooling element is selected from the centrally anchored cooling element and the edge anchored cooling element. Driving the cooling element may include driving the cooling element at a structural resonance for the cooling element resonant frequency for the cooling element. The frequency may correspond to an acoustic resonance. In some embodiments, the housing includes a depression therein. The active cooling system is configured to fit within the depression(s). The depression has a depth not exceeding two millimeters.

FIGS. 1A-1E are diagrams depicting an exemplary embodiment of active cooling system 100 usable with heat-generating structure 102 and including a centrally anchored cooling element 120. For clarity, only certain components are shown. FIGS. 1A-1E are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second.

In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121) z has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1E). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1E. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C = \lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, $\nu$, is at or near the structural resonant frequency for cooling element 120. The frequency $\nu$ is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1B:
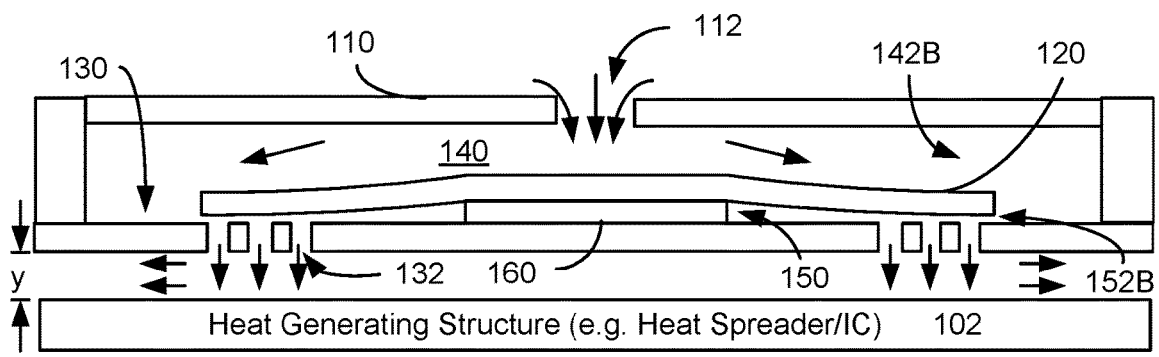
Figure 1C:
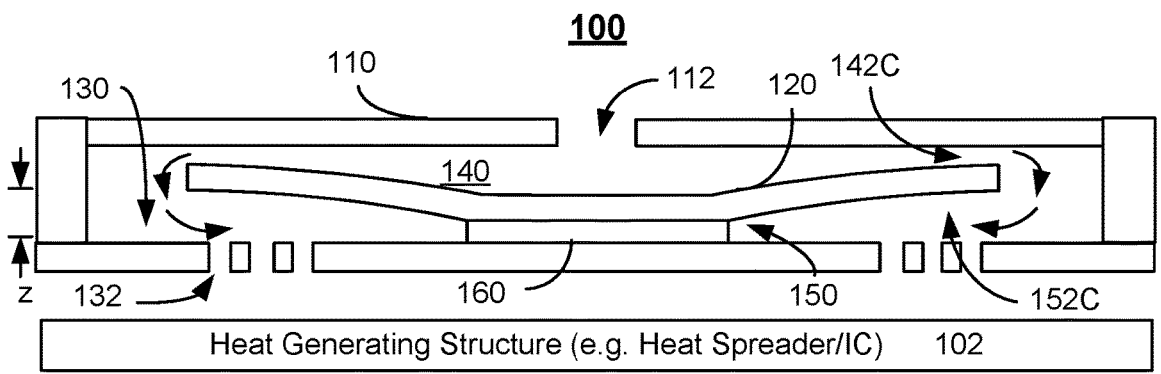

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 10.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Figure 1D:
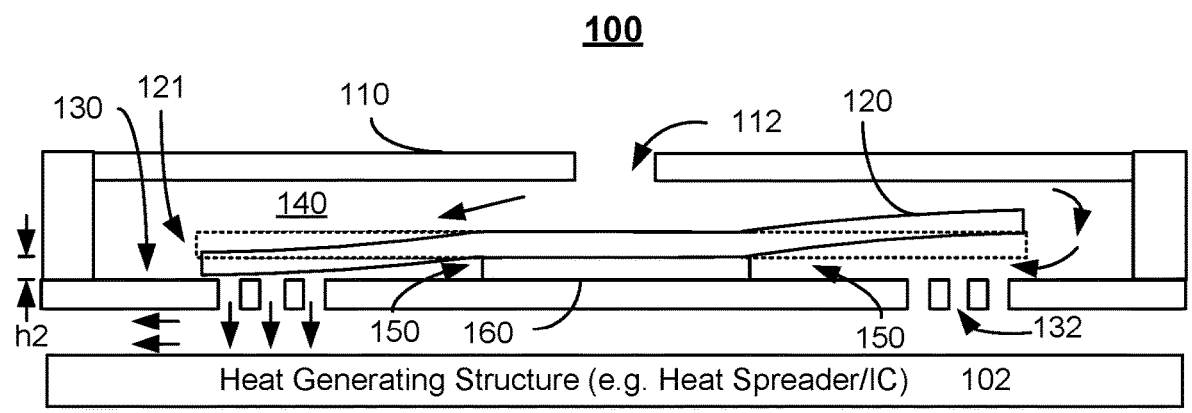
Figure 1E:
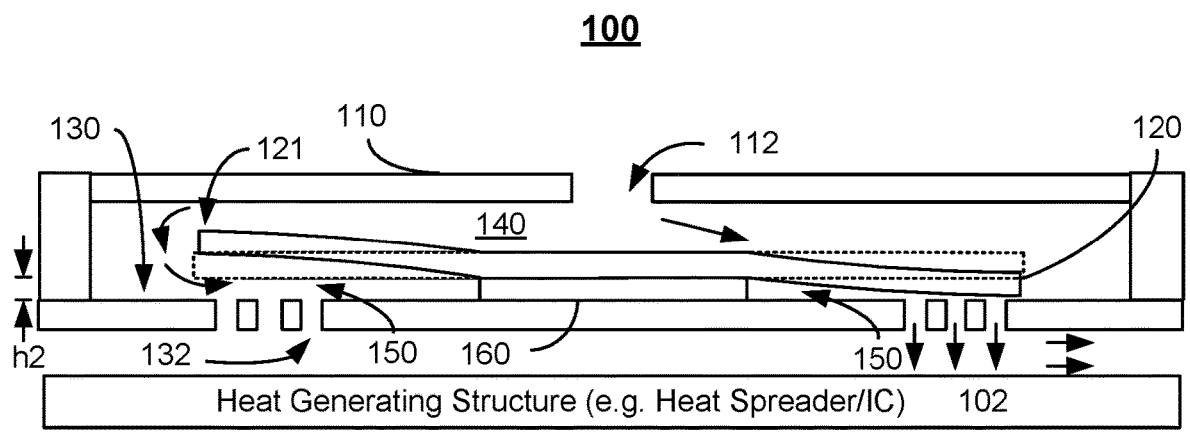

FIGS. 1D-1E depict an embodiment of active cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top cavity 140 to bottom cavity 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120 may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120 does not physically contact top plate 110 or orifice plate 130 during vibration. Thus, resonance of cooling element 120 may be more readily maintained. More specifically, physical contact between cooling element 120 and other structures disturbs the resonance conditions for cooling element 120. Disturbing these conditions may drive cooling element 120 out of resonance. Thus, additional power would need to be used to maintain actuation of cooling element 120. Further, the flow of fluid driven by cooling element 120 may decrease. These issues are avoided through the use of pressure differentials and fluid flow as discussed above. The benefits of improved, quiet cooling may be achieved with limited additional power. Further, out-of-phase vibration of cooling element 120 allows the position of the center of mass of cooling element 100 to remain more stable. Although a torque is exerted on cooling element 120, the force due to the motion of the center of mass is reduced or eliminated. As a result, vibrations due to the motion of cooling element 120 may be reduced. Moreover, efficiency of cooling system 100 may be improved through the use of out-of-phase vibrational motion for the two sides of cooling element 120. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
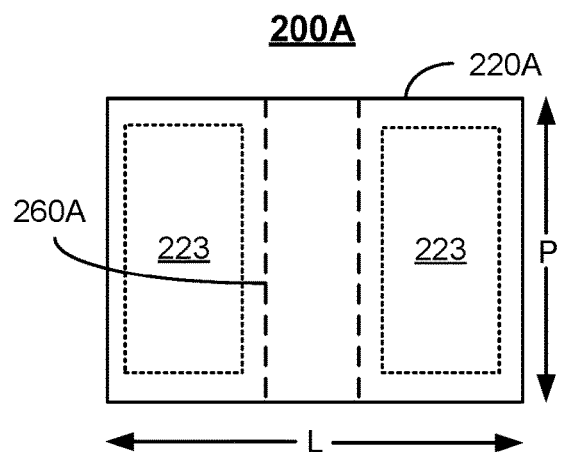
FIGS. 2A-2B depict embodiments of cooling elements usable in active cooling systems including centrally anchored cooling elements.
Figure 2B:
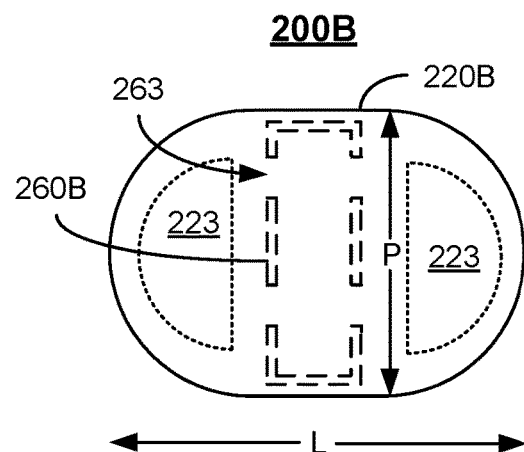

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120. Thus, the sizes and/or materials used for cooling elements 220A and/or 220B may be analogous to those for cooling element 120. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-1E. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. In some embodiments, piezoelectric 223 may be located in another region and/or have a different configuration. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 220A is pinned. The unpinned portions of the perimeter of cooling element 220A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

Figure 3A:
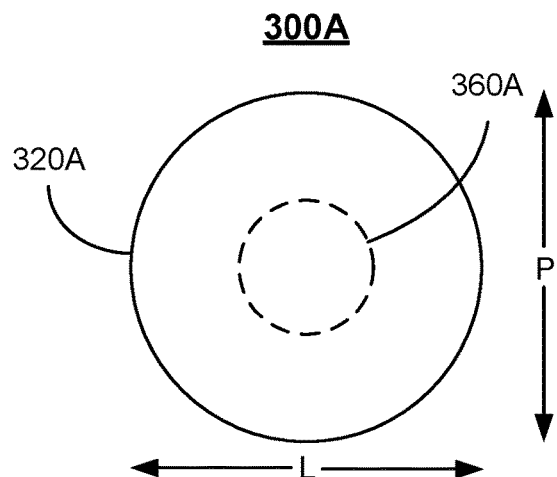
FIGS. 3A-3B depict embodiments of cooling elements usable in active cooling systems including centrally anchored cooling elements.
Figure 3B:
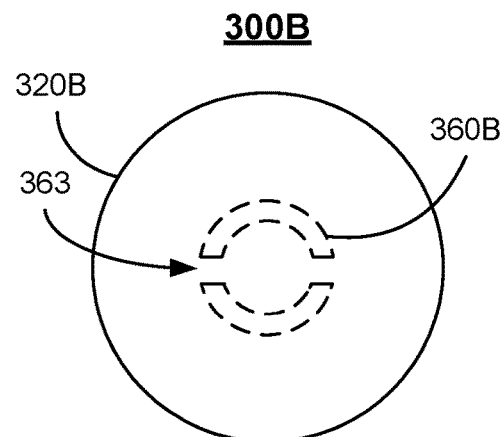

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120. Thus, the sizes and/or materials used for cooling elements 320A and/or 320B may be analogous to those for cooling element 120. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1E. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

In some embodiments, the cooling element may be anchored at one or more edges instead of at its center. For example, FIGS. 4A-4C depict an embodiment of cooling system 400 in which the edges of the cooling elements are anchored.

Figure 4A:
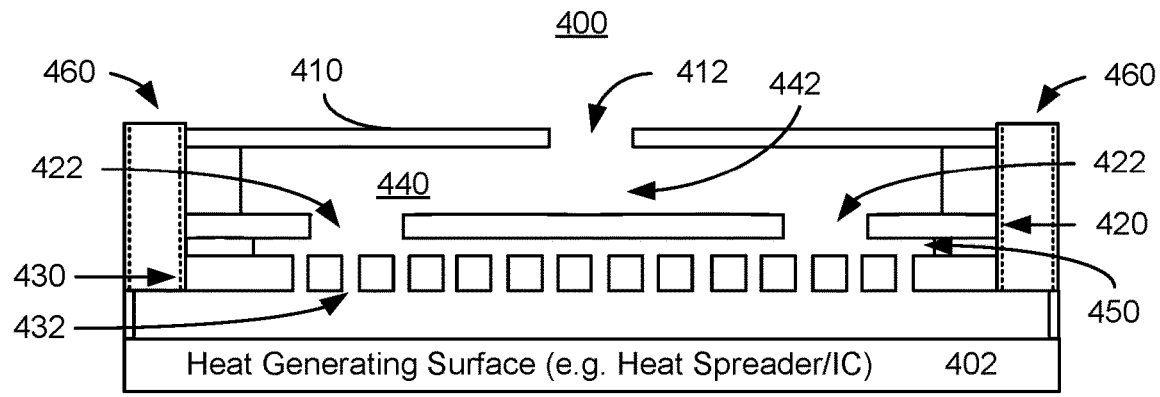
FIGS. 4A-4C are diagrams depicting an embodiment of an active cooling system.
Figure 4B:
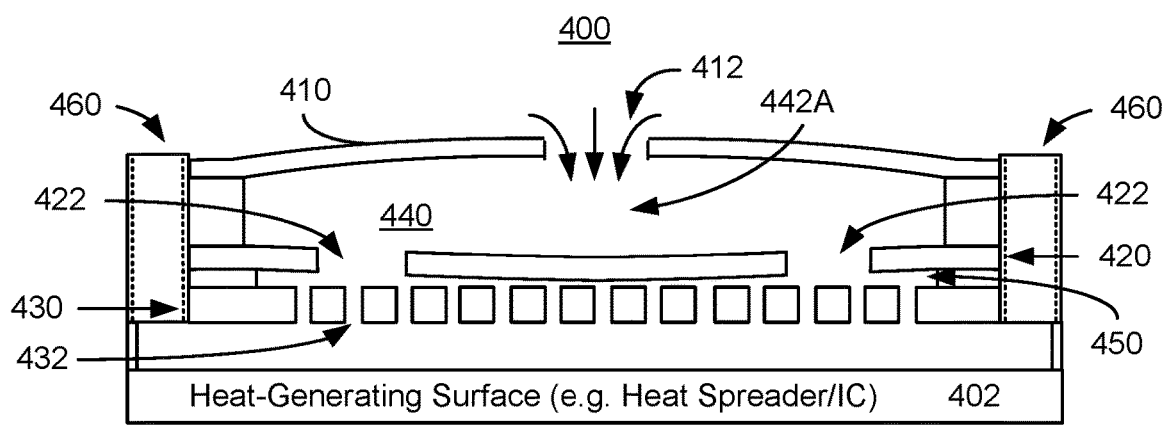
Figure 4C:
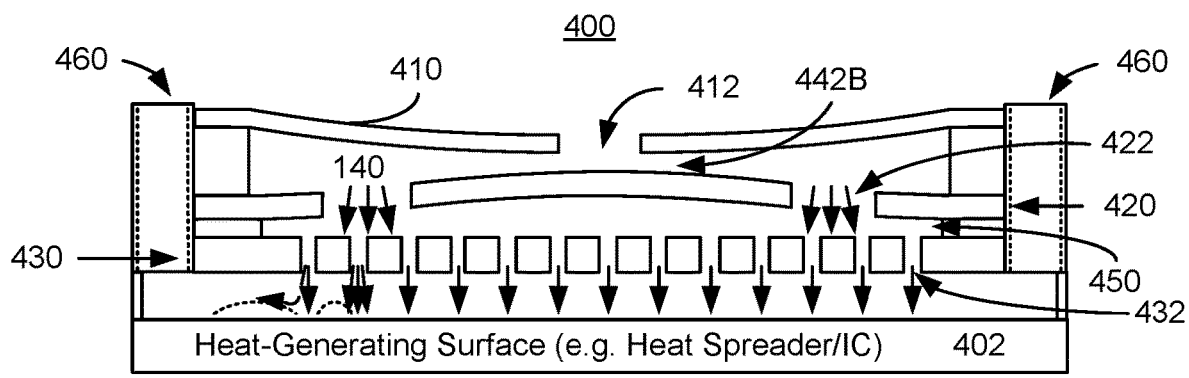

FIGS. 4A-4C are diagrams depicting an exemplary embodiment of active cooling system 400 usable with a heat-generating structure 402. For clarity, only certain components are shown and FIGS. 4A-4C are not to scale. Cooling system 400 is used in connection with a heat-generating structure 402. Although shown as symmetric, cooling system 400 need not be symmetric.

Cooling system 400 includes cooling elements 410 and 420. Cooling system 400 also includes orifice plate 430 having orifices 432 therein, top chamber 440 and bottom chamber 450 that may be analogous to orifice plate 130 having orifices 132 therein, top chamber 140 and bottom chamber 150. Also shown are optional chimneys 460 used to direct fluid.

Cooling element 410 has a first side distal from heat-generating structure 402 and a second side proximate to heat-generating structure 402. The first side of cooling element 410 is the top of cooling element 410 and the second side is the bottom of cooling element 410. Cooling element 410 also has a passive vent 412 therein. In the embodiment shown, passive vent 412 is a centrally located aperture in cooling element 410. In other embodiments, passive vent 412 may be located elsewhere. For example, passive vent 412 may be closer to one of the edges of cooling element 410. Passive vent 412 may have a circular, rectangular or other shaped footprint. Although one passive vent 412 is shown, multiple passive vents might be used.

Cooling element 420 is between cooling element 410 and heat-generating structure 402. In the embodiment shown, cooling element 420 is also between cooling element 410 and orifice plate 430. Cooling elements 410 and 420 are separated by gap 442 and form a top chamber 440. A bottom chamber 450 is formed between cooling element 420 and orifice plate 430. Cooling element 420 also has active vents 422 therein. In the embodiment shown, active vents 422 are apertures located away from the central region of cooling element 420. In other embodiments, active vents 422 may be located elsewhere. For example, an active vent may be centrally located in cooling element 420. Although two active vents 422 are shown, another number (e.g. one, three, etc.) might be present. In some embodiments, active vents 422 are positioned such that the active vents 422 are not aligned with passive vent 412. Active vents 422 may have circular, rectangular or other shaped footprints. In some embodiments, a single cooling element 410 or 420 which does not include a vent may be used in lieu of two cooling elements.

In some embodiments, cooling system 400 includes chimneys 460. Chimneys 460 provide a return path for heated fluid to flow away from heat-generating structure 402. In some embodiments, chimneys 460 return fluid to the side of cooling element 410 distal from heat-generating structure 402. In the embodiment shown, chimneys 460 direct heated fluid substantially perpendicular to heat-generating structure 402 and toward the side of cooling element 410 distal from heat-generating structure 402. In other embodiments, chimneys 460 may be omitted or configured in another manner. For example, chimneys may instead directed fluid away from heat-generating structure 402 in a direction parallel to heat-generating structure 402 or perpendicular to heat-generating structure 402 but opposite to the direction shown (e.g. toward the bottom of the page). If multiple cooling systems 400 are provided in an array, each cooling system 400 may include chimneys, only cooling systems 400 at the edges may include chimneys, other ducting may be provided at the edges or other locations in the array to provide a path for heated fluid to flow and/or other mechanisms may be used to allow heated fluid to be removed from the region proximate to heat-generating structure 402.

FIG. 4A depicts cooling system 400 in a neutral position. Thus, cooling elements 410 and 420 are shown as substantially flat. In operation, piezoelectric cooling elements 410 and 420 are actuated to vibrate between positions shown in FIGS. 4B and 4C. Piezoelectric cooling elements 410 and 420 are, therefore, piezoelectric actuators. Operation of cooling system 400 is described in the context of FIGS. 4B and 4C. Referring to FIG. 4B, piezoelectric cooling element 410 has been actuated to move away from (deform to be convex) heat-generating structure 402, while piezoelectric cooling element 420 has been actuated to move toward (deform to be concave) heat-generating structure 402. This configuration is referred to as the suction arrangement. Because of the vibrational motion of piezoelectric cooling elements 410 and 420, gap 442 has increased in size and is shown as gap 442A. For example, in some embodiments, gap 442 has a height of at least ten and not more than twenty micrometers in the neutral position (FIG. 4A). Gap 442A may have a height of at least twenty and not more than thirty micrometers in the suction arrangement (FIG. 4B). Thus, top chamber 440 has increased in volume, while bottom chamber 450 has decreased in volume. In the suction arrangement, the flow resistance of passive vent 412 (passive suction flow resistance) is low. Consequently, the pressure at passive vent 412 is low. In contrast, the flow resistance of active vent 422 (active suction flow resistance) is high. Consequently, the pressure at active vent 422 is high. Because of the low passive suction flow resistance, fluid is drawn into top chamber 440 through passive vent 412. This is shown by arrows in FIG. 4B. However, fluid does not flow out of (or flows out to a limited extent) active vent 422 because of the high passive suction flow resistance. However, active vent 422 is not physically closed in this configuration. For example, active vent 422 is not in contact with orifice plate 430 in the suction arrangement.

FIG. 4C depicts an expulsion arrangement. Piezoelectric cooling element 410 has been actuated to move toward (deform to be concave) heat-generating structure 402, while piezoelectric cooling element 420 has been actuated to move away from (deform to be convex) heat-generating structure 402. Because of the vibrational motion of piezoelectric cooling elements 410 and 420, gap 442 has decreased in size and is shown as gap 442B. For example, in some embodiments, gap 442 has a height of at least ten and not more than twenty micrometers in the neutral position (FIG. 4A). Gap 442B has a height of at least five and not more than ten micrometers in the expulsion arrangement (FIG. 4C). Thus, top chamber 440 has decreased in volume, while bottom chamber 450 has increased in volume. In the expulsion arrangement, the flow resistance of passive vent 412 (passive expulsion flow resistance) is high. Consequently, the pressure at passive vent 412 is high. In contrast, the flow resistance of active vent 422 (active expulsion flow resistance) is low. Consequently, the pressure at active vent 422 is low. Because of the low active expulsion flow resistance, fluid is expelled from top chamber 440 through active vent 422, into bottom chamber 450 and through orifices 432. This is shown by arrows in FIG. 4C. However, fluid does not flow out of (or flows out to a limited extent) passive vent 412 because of the high passive expulsion flow resistance. Thus, passive vent 412 is considered closed and active vent 422 is considered open in the expulsion arrangement. However passive vent 412 is not physically closed in this configuration. For example, passive vent 412 is not in contact with cooling element 420 in the expulsion arrangement. Gap 442B does not have a zero length.

Virtual valves may be considered to be formed at or near active vent 422 and passive vent 412. A virtual valve has a high, but not infinite, flow resistance when closed. Thus, a virtual valve does not physically block flow but instead uses a high flow resistance or high pressure to throttle or prevent flow. A virtual valve has a significantly lower flow resistance or pressure when open, allowing flow. In some embodiments, the ratio of flow resistances or pressures between closed and open for a virtual valve is at least three and not more than ten. Thus, active vent 422 and its virtual valve ("active virtual valve") are considered closed in the suction arrangement because the flow resistance is sufficiently high that little or no fluid flows through active vent 422 in the suction arrangement. Passive vent 412 and its virtual valve ("passive virtual valve") are considered open in the suction arrangement because the pressure or flow resistance is sufficiently low to allow fluid to be drawn in to top chamber 440 through passive vent 412. In contrast, active vent 422 and active virtual valve are considered open in the expulsion arrangement because the pressure or flow resistance is sufficiently low to allow fluid to flow through active vent 422 and be driven out of orifices 432. Passive vent 412 and passive virtual valve are considered closed in the expulsion arrangement because the pressure or flow resistance is sufficiently high that little to no fluid is drawn through passive vent 412 in the expulsion arrangement.

Due to the vibrational motion of cooling elements 410 and 420 (and the attendant decrease in gap 442A/442B from FIG. 4B to FIG. 4C), the fluid is drawn in to top chamber 440 and through orifices 432. The motion of the fluid is shown by arrows through orifices 432. The fluid may spread as it travels away from orifice plate 420, as shown by dashed lines and arrows for some orifices 432 in FIG. 4C. The fluid deflects off of heat-generating structure 402 and travels along the channel between heat-generating structure 402 and orifice plate 430.

The motion between the positions shown in FIGS. 4B and 4C may be repeated. Thus, piezoelectric cooling elements 410 and 420 vibrate, drawing fluid through passive vent 412 from the distal side of cooling element 410, into top chamber 440, out of chamber 440 through active vent 422 and pushing the fluid through orifices 432 and toward heat-generating structure 402. In some embodiments, the frequency/frequencies of vibration of cooling elements 410 and/or 420 are analogous to those of cooling element 120. Further, in some embodiments, piezoelectric cooling element(s) 410 and/or 420 may be driven at or near the resonant frequency. The resonant frequencies of piezoelectric cooling element(s) 410 and 420 may also be desired to be close. In some embodiments, the resonant frequencies of piezoelectric cooling element(s) 410 and 420 are desired to be within one hundred Hertz. In some embodiments, feedback is used to maintain piezoelectric cooling element(s) 410 and/or 420 at or near resonance. In some embodiments, the resonant frequencies of cooling elements 410 and/or 420 are closely matched to the acoustic resonant frequencies of chamber(s) 440 and/or 450. In some embodiments, the speed at which the fluid impinges on heat-generating structure 402 is in the ranges described herein for cooling system 100.

As indicated in FIG. 4C, the fluid driven toward heat-generating structure 402 may move substantially normal (perpendicular) to the top surface of heat-generating structure 402. In other embodiments, the fluid motion may have a nonzero acute angle with respect to the normal to the top surface of heat-generating structure 402. In either case, the fluid may thin and/or form apertures in the boundary layer of fluid at heat-generating structure 402. The boundary layer in one case is indicated by the curved dotted lines at the top surface of heat-generating structure 402 in FIG. 4C. As a result, transfer of heat from heat-generating structure 402 may be improved. The fluid deflects off of heat-generating structure 402, traveling along the surface of heat-generating structure 402. In some embodiments, the fluid moves in a direction substantially parallel to the top of heat-generating structure 402. Thus, heat from heat-generating structure 402 may be extracted by the fluid. The fluid may exit the region between orifice plate 430 and heat-generating structure 402 at the edges of cooling system 400. In the embodiment shown, chimneys 460 at the edges of cooling system 400 allow fluid to be carried away from heat-generating structure 402. In other embodiments, heated fluid may be transferred further from heat-generating structure 402 in another manner. The fluid may return to the distal side of cooling elements 410 where the fluid may exchange the heat transferred from heat-generating structure 402 to another structure or to the ambient environment. The fluid may then be circulated through cooling system 400 to extract additional heat. In other embodiments, heated fluid is carried away and replaced by new fluid at the distal side of cooling element 410. As a result, heat-generating structure 402 may be cooled.

Opening and closing of passive vent 412 (passive virtual valve) and active vent 422 (active virtual valve) to draw fluid into chamber 450 and expel fluid through orifices 432 is based upon dynamic changes to flow resistance. In some embodiments, the ratio of active suction flow resistance to active expulsion flow resistance is at least three. In some such embodiments, the ratio of active suction flow resistance to active expulsion flow resistance is not more than ten. In some embodiments, the ratio of passive expulsion flow resistance to passive suction flow resistance is at least three. In some such embodiments, the ratio of passive expulsion flow resistance to passive suction flow resistance is not more than ten. Thus, virtual valves corresponding to vents 410 and/or 420 may be opened and closed. These ratios of pressures may be considered to be due to the change in size of gap 442/442A/442B (e.g. five through thirty micrometers in some embodiments). In some embodiments, the difference in pressure between being open and closed is 0.1 atmosphere through 0.2 atmosphere. For example, the pressure at passive vent 412 in the suction arrangement may be at least 0.1 atmosphere and not more than 0.2 atmosphere less than the pressure at passive vent 412 in the expulsion arrangement. Similarly, the pressure at active vent 422 in the expulsion arrangement may be at least 0.1 atmosphere and not more than 0.2 atmosphere less than the pressure at active vent 422 in the suction arrangement.

Using the cooling system 400, fluid may be drawn in through passive vent 412 (in the suction arrangement) and driven through active vent 422 and orifices 432 (in the expulsion arrangement). Thus, the fluid may efficiently dissipate heat from heat-generating structure 402 in a manner analogous to the fluid driven by cooling system 100. Thus, performance of a device utilizing cooling system 400 may be improved. Further, cooling system 400 may be a MEMS device. Thus, cooling system 400 may small-having a total height not exceeding five hundred micrometers. Consequently, cooling systems 400 may be suitable for use in mobile devices, such as smart phones, other mobile phones, virtual reality headsets, tablets, two-in-one computers, wearables and handheld games, in which limited space is available. Active cooling system 400 may also be used in other compute devices. Because piezoelectric cooling element(s) 410 and/or 420 may be vibrated at ultrasonic frequencies, users may not hear any noise associated with actuation of cooling elements. If driven at or near resonance frequency for the first and second piezoelectric cooling element(s), the power used in operating cooling systems may be significantly reduced.

Figure 5A:
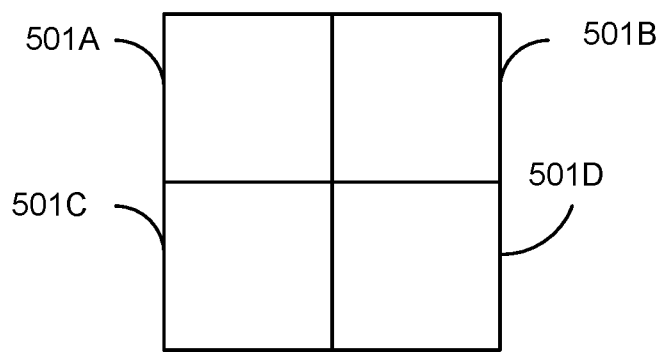
FIGS. 5A-5E depict an embodiment of an active cooling system formed in a tile.
Figure 5B:
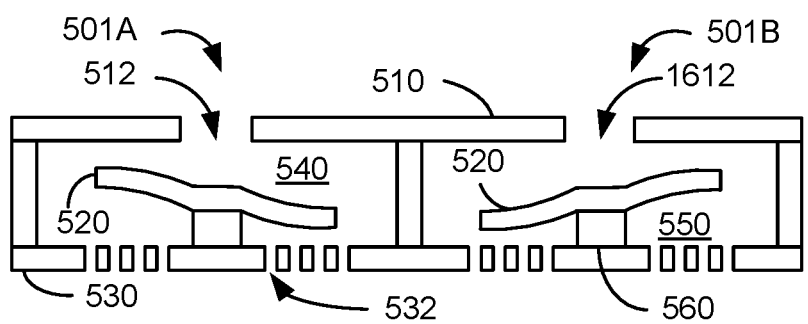
Figure 5C:
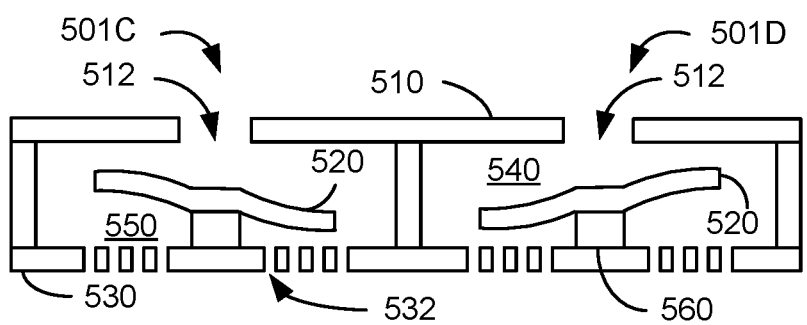
Figure 5D:
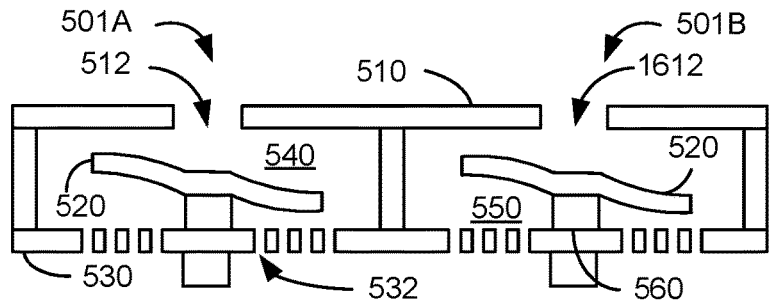
Figure 5E:
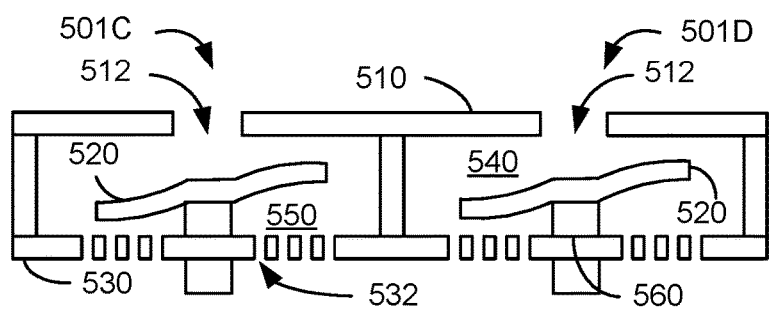

FIGS. 5A-5E depict an embodiment of active cooling system 500 including multiple cooling cells configured as a tile, or array. FIG. 5A depicts a top view, while FIGS. 5B-5E depict side views. FIGS. 5A-5E are not to scale. Cooling system 500 includes four cooling cells 501A, 501B, 501C and 501D (collectively or generically 501), which are analogous to one or more of cooling systems described herein. More specifically, cooling cells 501 are analogous to cooling system 100. In some embodiments, cooling cell(s) 501 may be analogous to cooling system 400 and/or another cooling system. Although four cooling cells 501 in a 2×2 configuration are shown, in some embodiments another number and/or another configuration of cooling cells 501 might be employed. In the embodiment shown, cooling cells 501 include shared top plate 510 having apertures 512, cooling elements 520, shared orifice plate 530 including orifices 532, top chambers 540, bottom chambers 550 and anchors (support structures) 560 that are analogous to top plate 110 having apertures 112, cooling element 120, orifice plate 130 having orifices 132, top chamber 140, bottom chamber 150 and anchor 160. In some embodiments, cooling cells 501 may be fabricated together and separated, for example by cutting through top plate 510 and orifice plate 530. Cooling elements 520 are driven out-of-phase (i.e. in a manner analogous to a seesaw). Further, as can be seen in FIGS. 5B-5C and FIGS. 5D-5E cooling element 520 in one cell is driven out-of-phase with cooling element(s) 520 in adjacent cell(s). In FIGS. 5B-5C, cooling elements 520 in a row are driven out-of-phase. Thus, cooling element 520 in cell 501A is out-of-phase with cooling element 520 in cell 501B. Similarly, cooling element 520 in cell 501C is out-of-phase with cooling element 520 in cell 501D. In FIGS. 5D-5E, cooling elements 520 in a column are driven out-of-phase. Thus, cooling element 520 in cell 501A is out-of-phase with cooling element 520 in cell 501C. Similarly, cooling element 520 in cell 501B is out-of-phase with cooling element 520 in cell 501D. By driving cooling elements 520 out-of-phase, vibrations in cooling system 500 may be reduced.

Cooling cells 501 of cooling system 500 function in an analogous manner to cooling system(s) 100, 400, and/or an analogous cooling system. Consequently, the benefits described herein may be shared by cooling system 500. Because cooling elements in nearby cells are driven out-of-phase, vibrations in cooling system 500 may be reduced. Because multiple cooling cells 501 are used, cooling system 500 may enjoy enhanced cooling capabilities. Further, multiples of individual cooling cells 501 and/or cooling system 500 may be combined in various fashions to obtain the desired footprint of cooling cells.

Figure 6:
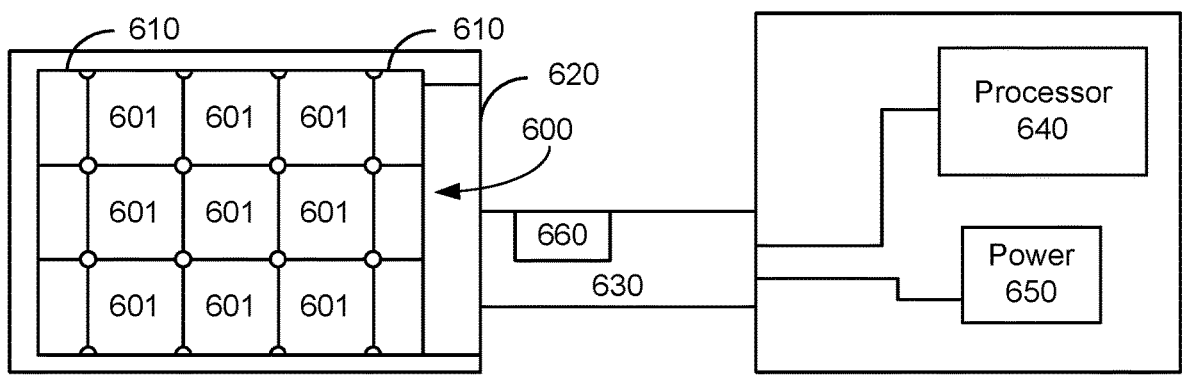
FIG. 6 is a diagram depicting an exemplary embodiment of an active cooling system and associated electronics.

FIG. 6 is a diagram depicting an exemplary embodiment of active cooling system 600 and associated electronics. For clarity, only certain components are shown. FIG. 6 is not to scale. Active cooling system 600 is analogous to those described herein, such as systems 100, 400 and/or 500. In the embodiment shown, cooling system 600 includes cells 601 that may have optional having chimneys (unlabeled circles) between the cells. Cells 601 are analogous to cells 501 described herein that include a cooling element that moves fluid from the distal to the proximal side of the cooling element and may include an orifice plate having orifices therein. Thus, active cooling system 600 is analogous to active cooling system 500. In other embodiments, other configurations may be used. Further additional and/or other arrays of cooling cells may be used.

Also shown are processor 640 and power source 650 that may be a power management integrated circuit (PMIC) that may be part of the components already present in the mobile or other device in which cooling system 600 is used. Although shown as distal from cooling system 600, in some embodiments processor and/or power source 650 may be cooled using cooling system 600 (i.e. cooling cells 601). Also shown are electronics 620, interface 630 and controller 660. Interface 630 communicates with processor 640 and power source 650, as well as any desired remaining components of the device. Interface 630 may include a flexible connector. For example, interface 630 may receive signals from temperature sensors located on portions of the device which are desired to be cooled. Power to active cooling system 600 is also provided from power source 650 via interface 630. Electronics 620 includes a communications interface for receiving control signals and addressing circuitry for selectively activating individual cells 601 or groups of cells 601. For example, addressing circuitry might include row and column selectors managed by controller 660. Controller 660 thus selectively drives cells 601 via electronics 620. In some embodiments, software used to control active cooling system 600 is implemented by processor 640. For example, processor 640 may implement software used to tune cooling elements to the structural and/or acoustic resonance. In some embodiments, some or all of the functions of processor 640 may be incorporated into controller 660. In some such embodiments, processor 640 may be omitted. Thus, individual cells 601 or groups of cells 601 can be selectively driven. Further, although a single array 600 is shown, multiple arrays may be driven using the same electronics 620, 630, 640, 650 and 660.

Figure 7A:
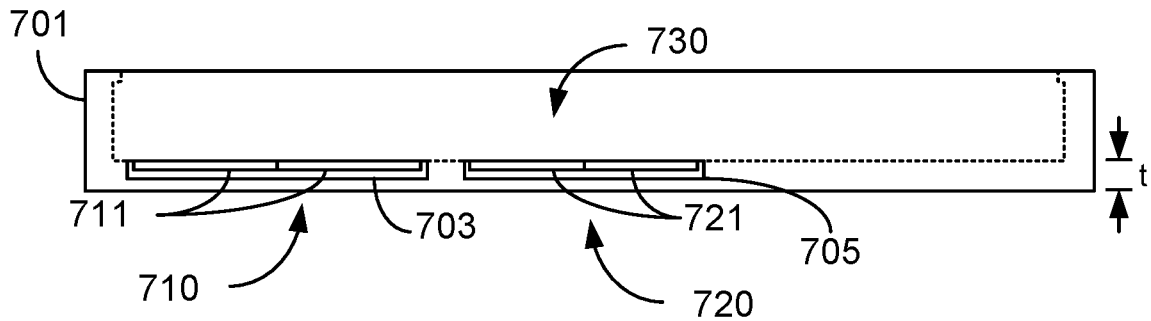
FIGS. 7A-7C are diagrams depicting an exemplary embodiment of a mobile device case including an active cooling system.
Figure 7B:
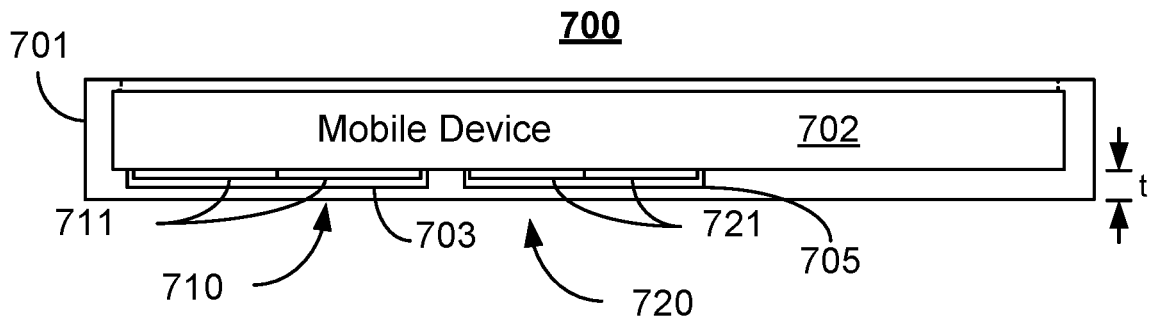
Figure 7C:
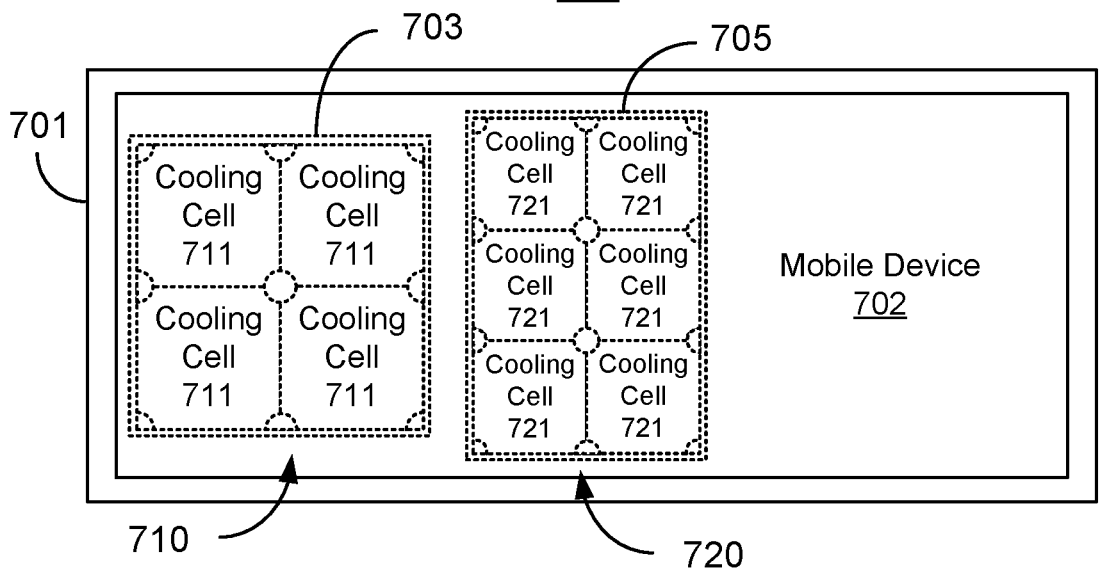

FIGS. 7A-7C are diagrams depicting an exemplary embodiment of a mobile device case 700 including active cooling systems 710 and 720. FIG. 7A depicts a side view of case 700. FIGS. 7B and 7C depict side and plan views of case 700 combined with mobile device 702. For clarity, only certain components are shown and FIGS. 7A-7C are not to scale. Some features that may be hidden in a particular view, such as cavity 730 in FIG. 7A and cooling cells 711 and 721 in FIG. 7C are shown with dotted lines. Mobile device 702 may be a smartphone, other mobile (e.g. cellular) phone, notebook computer or other device with which case 700 may be used. Thus, a particular physical configuration of case 700 is used to carry mobile device 702. In another embodiment, case 700 may have a different configuration and/or be configured to fit with another mobile device (not shown).

Case 700 includes housing 701 and active cooling systems 710 and 720. Housing 701 includes cavity 730 therein. Cavity 730 is configured to fit mobile device 702. In some embodiments, cavity 730 may include a lip or other mechanism configured to retain mobile device 702 in case 700. In another embodiment, cavity 730 may have other openings, may not enclose the bottom and/or sides of mobile device 702, and/or may have another configuration. Also shown are depressions 703 and 705 in which active cooling systems 710 and 720 reside. In some embodiments, active cooling systems 710 and/or 720 may be integrated with housing 701 in another manner. In some embodiments, an inlet path for fluid (e.g. air) driven by active cooling systems 710 and/or 720 may be provided in housing 701. Similarly, housing 701 may include an outlet path (not shown) for fluid to escape case 700. For example, apertures may be included in housing 701 near depressions 703 and 705 such that fluid may be drawn into active cooling systems 710 and/or 720 and expelling heated fluid used to transfer heat from mobile device 702. Because the profile of active cooling systems 710 and 720 may be small, housing 701 may also be thin. For example, the thickness, t, of housing 701 may be not more than three millimeters. In some embodiments, the thickness of housing 701 may be not more than two millimeters.

Case 700 also includes cooling cells 711 and 721. Although shown as being enclosed in the housing, in some embodiments, some or all of cooling cells 711 and/or 721 may be open to the environment. For example, a fluid path through the bottom of case 700 (e.g. opposite to cavity 730) to one or more cooling cells 711 and/or 721 may be present. Although two arrays of cooling cells 711 and 721 are shown, another number of arrays (i.e. fewer or more arrays) that may include another number of cooling cells may be used. In the embodiment shown, cooling cells 721 have the same footprint shape as but a different size than cooling cells 711. However, in another embodiment, cooling cells 711 may have the same size and/or a footprint shape from cooling cells 721.

Cooling cells 711 and 721 may be analogous to systems 100 and/or 400 and/or to cooling cells 501. Cooling cells 711 and 721 each may include one or more cells including vibrating cooling elements, chambers, valves, orifice plates, orifices, optionally chimneys and/or other components analogous to those depicted and described herein. Thus, cooling cells 711 and 721 may be used to drive a fluid (e.g. air) through orifices at and/or along a surface of mobile device 702 at the speeds described herein. The fluid driven by cooling cells 711 and 721 extracts heat from the surface of mobile device 702. Cooling cells 711 and 730 may, therefore, cool mobile device 702 from the exterior of mobile device 702. In some embodiments, cooling cells 711 and 721 are located within case 700 such that the cooling cells 711 and/or 721 are proximate to heat generating regions of mobile device 702. For example, cooling cells 711 and 721 may be proximate to locations of the battery and processors, respectively, of mobile device 702.

In operation, cooling cells 711 and 721 include cooling elements (e.g. actuators), such as those described herein, that are driven to vibrate at high frequency. For example, cooling element(s) 120 and/or 410 and 420 may be included in one or more cooling cells 711 and/or 721. The cooling elements drive fluid through orifice(s) in orifice plate(s), toward the surface of mobile device 702. Stated differently, cooling elements in cooling cells 711 and 721 may use vibrational motion to drive fluid toward the surface of mobile device 702. Thus, cooling cells 711 and 721 may cool mobile device 702. In some embodiments, cooling cells 711 and/or 721 are controlled by a controller or other cooling software (not shown in FIGS. 7A-7C). For example, active cooling systems 710 and/or 720 may be configured in a manner analogous to system 600.

Various conditions may be used to activate and deactivate cooling systems 710 and/or 720. For example, some or all of cooling cells 711 and/or 721 may be controlled to switch on after a particular external cover temperature is reached or exceeded by mobile device 702, in response to a particular ambient temperature being reached or exceeded, in response to a user activating the cooling cells 711 and/or 721 (e.g. through an app), after a particular internal temperature is reached or exceeded in mobile device 702, after a particular surface temperature is reached or exceeded for mobile device 702, and/or in response to a notification by mobile device 702. For example, case 700 may include a temperature sensor (not shown in FIGS. 7A-7C) to sense the external temperature of mobile device 702 and to selectively activate some or all of cooling cells 711 and/or 721 based on the temperature sensed. In some embodiments, some or all of cooling cells 711 and/or 721 may be controlled in another manner.

In order to provide power to activate the cooling elements, cooling cells 711 and 721 are coupled with a power supply. Power may also be desired to be supplied to any other features of case 700 that utilize power. In the embodiment shown, cooling cells 711 and/or 721 are inductively coupled to the battery (not explicitly shown in FIGS. 7A-7C) of mobile device 702 or to another battery/power supply. In another embodiment, another power supply might be used including but not limited to an internal battery for case 700, a galvanic cell (e.g. provided through a user's touch), a solar cell and/or another power source.

Because cooling active systems 710 and/or 720 efficiently cool mobile device 702, heat-generating structure(s) within mobile device 702, such as processors, may be run at higher temperatures without adversely affecting performance. In some embodiments, therefore, mobile device 702 may be configured to increase the power targets for such heat-generating structures when used in connection with case 700. For example, the thermal governor is a protocol that a host device (e.g. mobile device 702) uses to predict the hot spots on the skin (outer surface of cover 701) based on the temperature sensors on the main logic board and processors (e.g. heat-generating structures for mobile device 702). The weights utilized for the thermal governor determine how processor operation is changed (e.g. throttled) based on the predicted skin temperature. Mobile device 702 may be configured such that the appropriate weights in the thermal governor are altered in the presence of case 700 to achieve improved performance. In some embodiments, a user may select reconfiguration of the weights in the thermal governor or other mechanism that increases power targets for the heat-generating structures when case 700 is used. In some embodiments, mobile device 702 senses the presence of case 700 having active cooling systems 710 and/or 720 or otherwise communicates with case 700. In such embodiments, mobile device 702 may automatically reconfigures the weights in the thermal governor or automatically reconfigures other mechanism(s) to increase the power targets. In some embodiments, mobile device 702 may have a mechanism for determining its external temperature, for example measuring its external (i.e. skin) temperature. Because the measured temperature of the case is reduced and/or hot spots reduced in temperature or eliminated when case 700 is used, mobile device 702 may operate at a higher power. Thus, a variety of mechanisms may be used for facilitating mobile device 702 in enhancing performance when used with case 700.

Thus, the benefits described herein may be provided in external cooling of mobile device 702. For example, significant cooling that may be quiet and use relatively low power due to resonance may be achieved for mobile device 702. Performance and/or reliability of mobile device 702 may, therefore, be improved. In addition, the surface of mobile device 702 may be sufficiently cooled to ensure that the user is not burned or otherwise injured by localized hot spots on the surface of mobile device 702. For example, the sustained operating power-a measure of performance-of heat-generating structures, such as processors, in mobile device 702 may be increased by a factor of at least two or more without generating hot spots having temperatures exceeding a maximum skin temperature of forty-five degrees Celsius (forty-three degrees Celsius in some embodiments) for mobile device 702. Other enhancements in performance may be achieved while reducing the temperature of or eliminating hot spots in other embodiments. These benefits may be achieved without requiring the internal configuration of mobile device 702 to be modified. Thus, mobile device case 700 that provides active cooling may be used in conjunction with a mobile device that includes internal active cooling systems and/or with a mobile device that does not incorporate internal active cooling systems. Moreover, mobile device case 700 may still provide the protective and aesthetic functions of conventional mobile device cases not having active cooling systems. Consequently, mobile device case 700 is not merely a cosmetic and protective covering, but also a performance enhancer for mobile device 702.

Figure 8A:
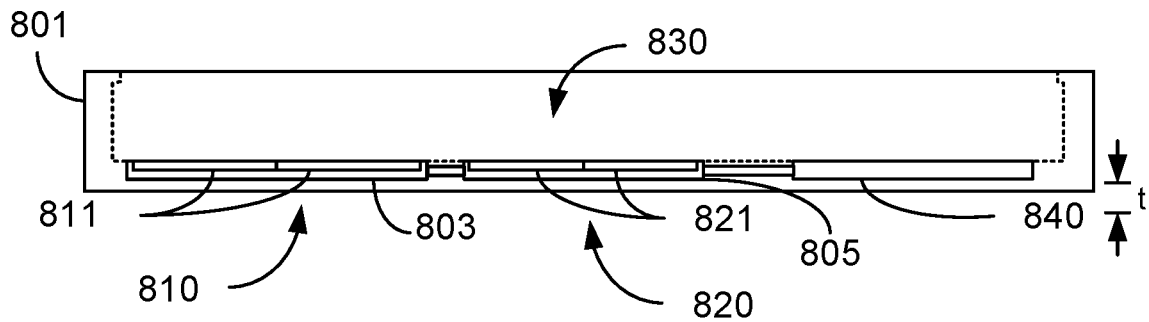
FIGS. 8A-8C are diagrams depicting an exemplary embodiment of a mobile device case including an active cooling system.
Figure 8B:
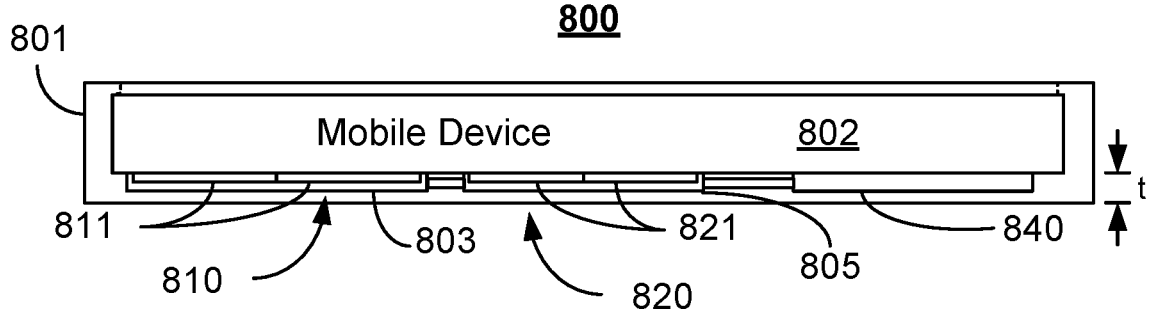
Figure 8C:
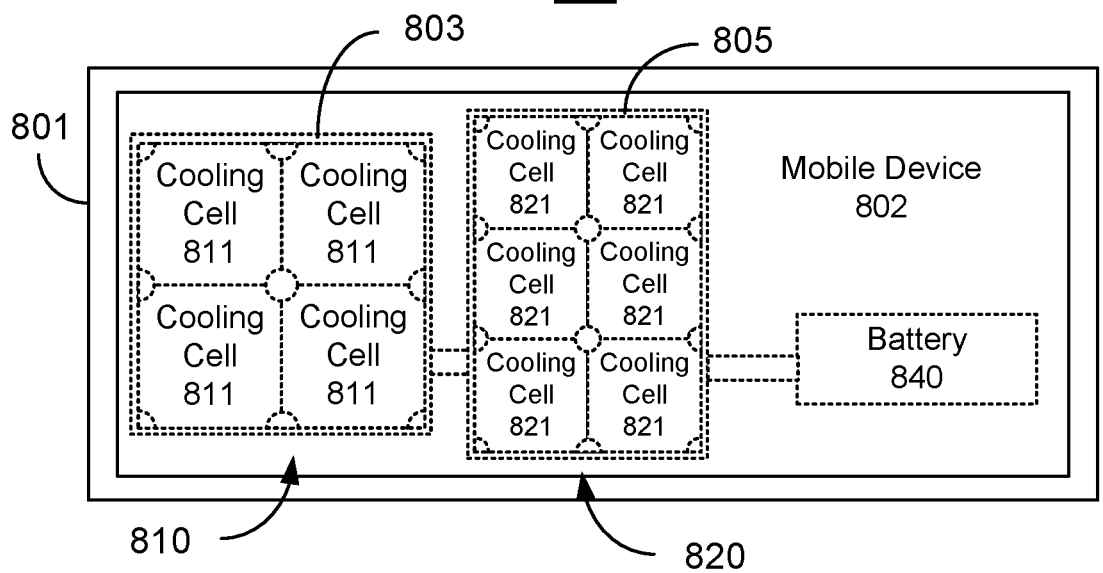

FIGS. 8A-8C are diagrams depicting an exemplary embodiment of a mobile device case 800 including an active cooling system. FIG. 8A depicts a side view of case 800. FIGS. 8B and 8C depict side and plan views of case 800 combined with mobile device 802. For clarity, only certain components are shown and FIGS. 8A-8C are not to scale. Some features that may be hidden in a particular view, such as the cavity in FIG. 8A and cooling cells in FIG. 8C are shown with dotted lines. Mobile device 802 may be a smartphone, other mobile (e.g. cellular) phone, notebook computer, or other device with which case 800 may be used. Thus, a particular physical configuration of case 800 is used to carry mobile device 802. In another embodiment, case 800 may have a different configuration configured to fit with another mobile device (not shown).

Case 800 includes housing 801 and active cooling systems 810 and 820. Case 800 is analogous to case 700. Thus, analogous components have similar labels. Thus, housing 801 and active cooling systems 810 and 820 are analogous to housing 701 and active cooling systems 710 and 720, respectively. Housing 801 includes cavity 830 and depressions 803 and 805 that are analogous to cavity 730 and depressions 703 and 705. Similarly, active cooling systems 810 and 820 include cooling cells 811 and 821, respectively, that are analogous to cooling cells 711 and 721, respectively. Thus, case 800 operates in an analogous manner to case 700. However, case 800 includes battery 840 (or other source of power) that is electrically coupled to active cooling systems 810 and/or 820. Thus, in the embodiment shown in FIGS. 8A-8C, a power source for active cooling systems 810 and/or 820 is incorporated into case 800.

Thus, the benefits described herein may be provided in external cooling of mobile device 802. For example, significant cooling that may be quiet and use relatively low power due to resonance may be achieved for mobile device 802. In some embodiments, therefore, mobile device 802 may be configured to allow heat-generating structures to run at higher temperatures when used in conjunction with case 800. Performance, usability, and/or reliability of mobile device 802 may, therefore, be improved. Moreover, these benefits may be achieved without requiring modifications to mobile device 802. Consequently, mobile device case 800 may not only perform cosmetic and protective functions of conventional mobile device cases, but also enhance performance of mobile device 802.

Figure 9A:
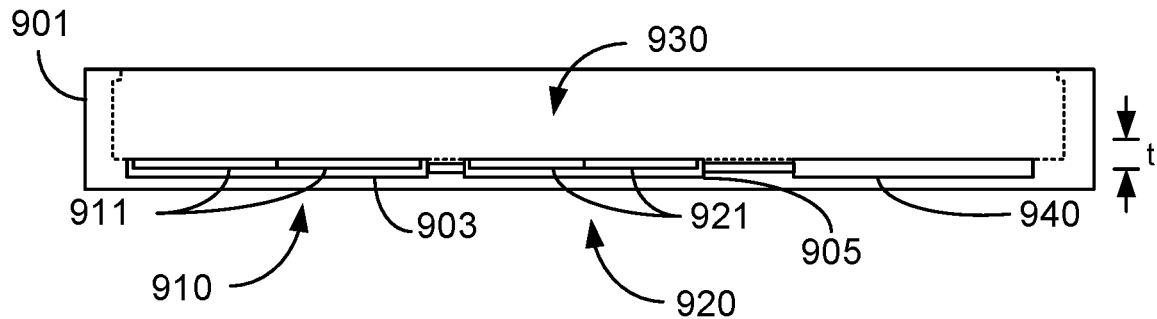
FIGS. 9A-9C are diagrams depicting an exemplary embodiment of a mobile device case including an active cooling system.
Figure 9B:
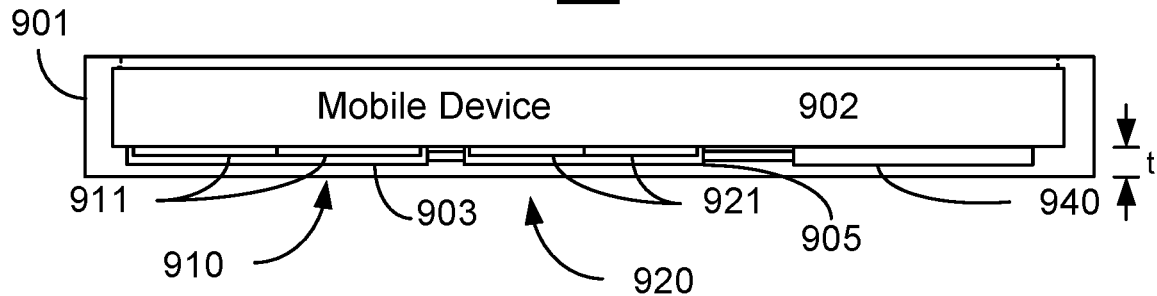
Figure 9C:
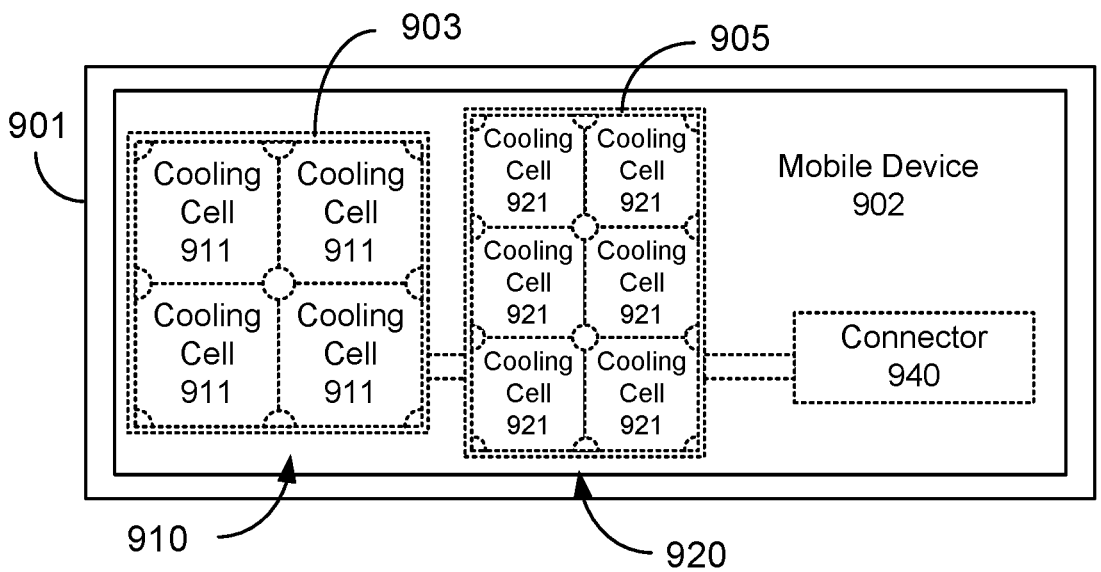

FIGS. 9A-9C are diagrams depicting an exemplary embodiment of a mobile device case 900 including an active cooling system. FIG. 9A depicts a side view of case 000. FIGS. 9B and 9C depict side and plan views of case 900 combined with mobile device 902. For clarity, only certain components are shown and FIGS. 9A-9C are not to scale. Some features that may be hidden in a particular view, such as the cavity in FIG. 9A and cooling cells in FIG. 9C are shown with dotted lines. Mobile device 902 may be a smartphone, other mobile (e.g. cellular) phone, notebook computer, or other device with which case 900 may be used. Thus, a particular physical configuration of case 900 is used to carry mobile device 902. In another embodiment, case 900 may have a different configuration configured to fit with another mobile device (not shown).

Case 900 includes housing 901 and active cooling systems 910 and 920. Case 900 is analogous to case(s) 700 and/or 800. Thus, analogous components have similar labels. Thus, housing 901 and active cooling systems 910 and 920 are analogous to housing 701 and active cooling systems 710 and 720, respectively. Housing 901 includes cavity 930 and depressions 903 and 905 that are analogous to cavity 730 and depressions 703 and 705. Similarly, active cooling systems 910 and 920 include cooling cells 911 and 921, respectively, that are analogous to cooling cells 711 and 721, respectively. Thus, case 900 operates in an analogous manner to case 700. However, case 900 includes connector 940 that is electrically coupled to active cooling systems 910 and/or 920 as well as to a power source (e.g. a battery) within mobile device 902. Thus, in the embodiment shown in FIGS. 9A-9C, active cooling systems 910 and 920 are energized by mobile device 902. Consequently, case 900 need not include a separate power supply.

Thus, the benefits described herein may be provided in external cooling of mobile device 902. For example, significant cooling that may be quiet and use relatively low power due to resonance may be achieved for mobile device 902. In some embodiments, therefore, mobile device 902 may be configured to allow heat-generating structures to run at higher temperatures when used in conjunction with case 900. Performance, usability, and/or reliability of mobile device 902 may, therefore, be improved. Moreover, these benefits may be achieved without requiring modifications to mobile device 902. Consequently, mobile device case 900 may not only perform cosmetic and protective functions of conventional mobile device cases, but also enhance performance of mobile device 902.

Figure 10A:
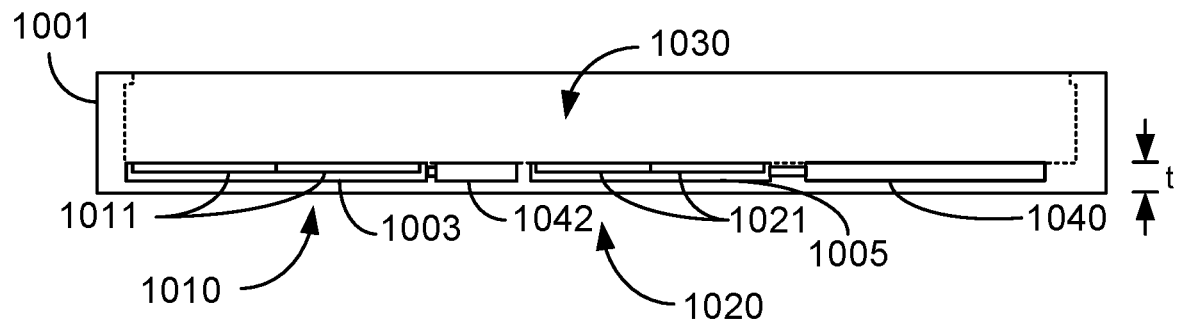
FIGS. 10A-10C are diagrams depicting an exemplary embodiment of a mobile device case including an active cooling system.
Figure 10B:
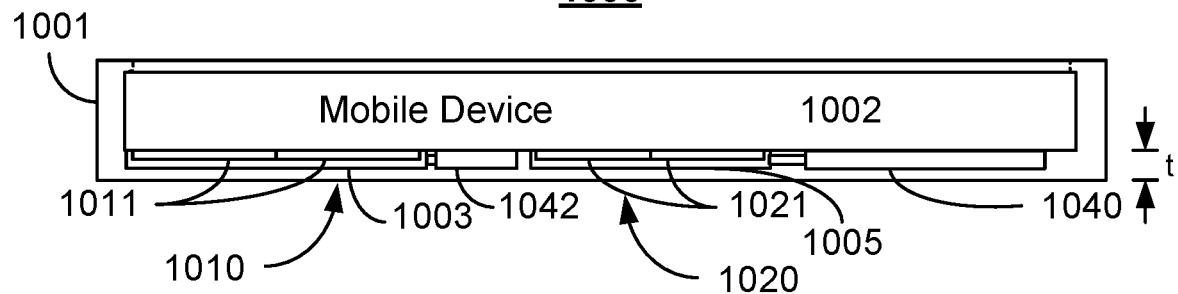
Figure 10C:
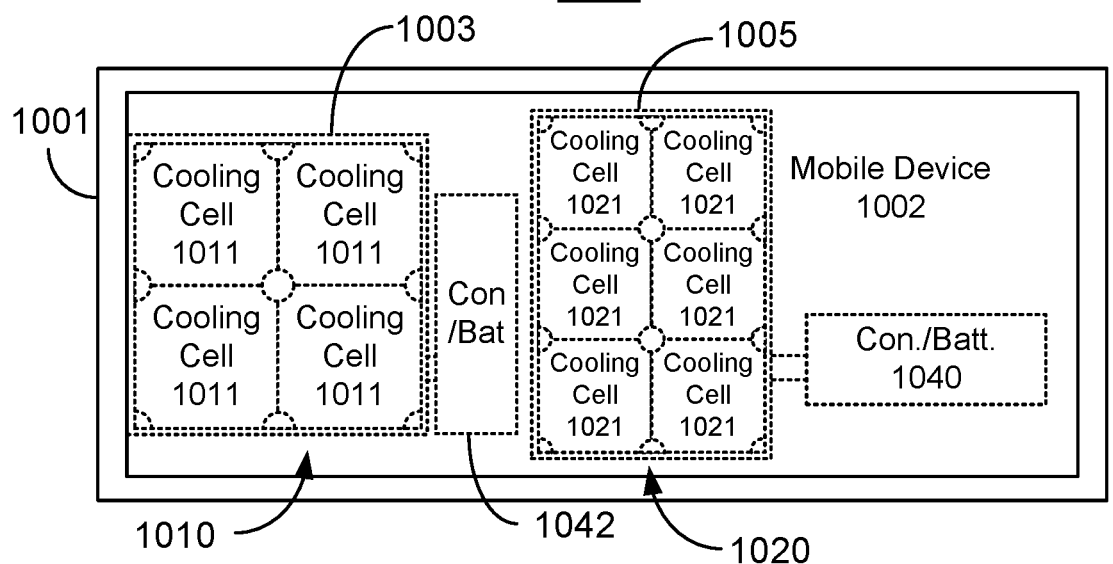

FIGS. 10A-10C are diagrams depicting an exemplary embodiment of a mobile device case 1000 including an active cooling system. FIG. 10A depicts a side view of case 1000. FIGS. 10B and 10C depict side and plan views of case 1000 combined with mobile device 1002. For clarity, only certain components are shown and FIGS. 10A-10C are not to scale. Some features that may be hidden in a particular view, such as the cavity in FIG. 10A and cooling cells in FIG. 10C are shown with dotted lines. Mobile device 1002 may be a smartphone, other mobile (e.g. cellular) phone, notebook computer, or other device with which case 1000 may be used. Thus, a particular physical configuration of case 1000 is used to carry mobile device 1002. In another embodiment, case 1000 may have a different configuration configured to fit with another mobile device (not shown).

Case 1000 includes housing 1001 and active cooling systems 1010 and 1020. Case 1000 is analogous to case(s) 700, 800 and/or 900. Thus, analogous components have similar labels. Thus, housing 1001 and active cooling systems 1010 and 1020 are analogous to housing 701 and active cooling systems 710 and 720, respectively. Housing 1001 includes cavity 1030 and depressions 1003 and 1005 that are analogous to cavity 730 and depressions 703 and 705. Similarly, active cooling systems 1010 and 1020 include cooling cells 1011 and 1021, respectively, that are analogous to cooling cells 711 and 721, respectively. Thus, case 1000 operates in an analogous manner to case 700. However, case 1000 includes connector/battery 1040 and connector/battery 1042. Connector/battery 1040 is electrically coupled with active cooling system 920, while connector/battery 1042 is electrically coupled to active cooling system 1010. Thus, active cooling systems 1010 and 1020 are separately powered. Further, either or both cooling systems 1010 and 1020 may be energized using a battery. For example, component 1040 may be a battery, while component 1042 is a connector to draw power from mobile device 1002. In some embodiments, component 1042 may be a battery, while component 1040 is a connector to draw power from mobile device 1002. Alternatively both active cooling systems 1010 and 1020 may be powered using a battery 1042 and 1040, respectively. In some embodiments, both cooling systems 1010 and 1020 may be powered by mobile device 1002 via connectors 1042 and 1040, respectively. Thus, a variety of configurations for providing power to active cooling systems 1010 and/or 1020 may be used.

Thus, the benefits described herein may be provided in external cooling of mobile device 1002. For example, significant cooling that may be quiet and use relatively low power due to resonance may be achieved for mobile device 1002. In some embodiments, therefore, mobile device 1002 may be configured to allow heat-generating structures to run at higher temperatures when used in conjunction with case 1000. Performance, usability, and/or reliability of mobile device 1002 may, therefore, be improved. Moreover, these benefits may be achieved without requiring modifications to mobile device 1002. Mobile device case 1000 may thus not only perform cosmetic and protective functions of conventional mobile device cases, but also enhance performance of mobile device 1002.

Figure 11:
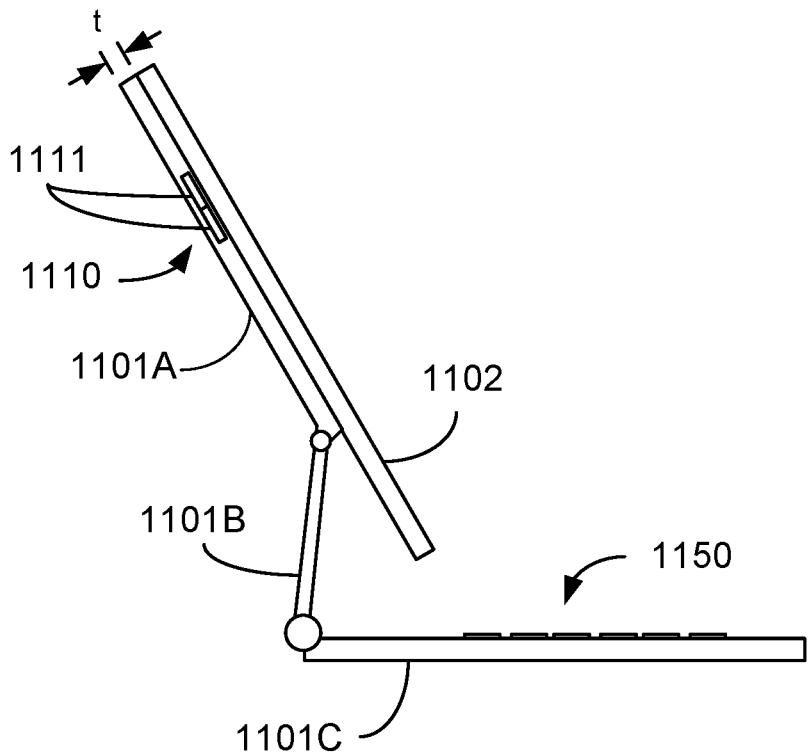
FIG. 11 is a diagram depicting an exemplary embodiment of a mobile device case including an active cooling system.

FIG. 11 is a diagram depicting an exemplary embodiment of mobile device case 1100 including active cooling system 1110 combined with mobile device 1102. For clarity, only certain components are shown and FIG. 11 is not to scale.

Mobile device 1102 may be a smartphone, other mobile (e.g. cellular) phone, notebook computer, or other device with which case 1100 may be used. Thus, a particular physical configuration of case 1100 is in connection with mobile device 1102. In another embodiment, case 1100 may have a different configuration configured to fit with another mobile device (not shown).

Case 1100 includes housing having sections 1101A, 1101B and 1101C (collectively housing 1101) and active cooling system 1110. Case 1100 is analogous to case(s) 700, 800, 900 and/or 1100. Analogous components have similar labels. Thus, housing 1101 and active cooling systems 1110 are analogous to housing 701 and active cooling systems 710 and 720, respectively. Although only one active cooling system 1110 is shown, in some embodiments, case 1100 may include multiple active cooling systems. Although not labeled in FIG. 11, section 1101A of housing 1100 includes a mechanism for retaining mobile device 1102. In addition, although not shown in FIG. 11, housing 1100 also includes a battery, connector, A/C adapter or other mechanism for providing power to active cooling system 1110. The thickness, t, of housing section 1101A is also analogous to the thickness of cases 700, 800, 900 and/or 1100. Active cooling system 1110 includes cooling cells 1111 that are analogous to cooling cells 711 and/or 721. Thus, case 1100 operates in an analogous manner to case 700.

Case 1100 also provides other functions. Keyboard 1150 is incorporated into housing section 1101C. As a result, a user need not work on a keyboard (e.g. a touch screen) associated with mobile device 1102. In some embodiments, other and/or additional features may be incorporated into case 1100. Thus, case 1100 may provide additional functionality for a user.

The benefits described herein may be provided in external cooling of mobile device 1102. For example, significant cooling that may be quiet and use relatively low power due to resonance may be achieved for mobile device 1102. In some embodiments, therefore, mobile device 1102 may be configured to allow heat-generating structures to run at higher temperatures when used in conjunction with case 1100. Performance, usability, and/or reliability of mobile device 1102 may, therefore, be improved. Moreover, these benefits may be achieved without requiring modifications to mobile device 1102. Additional functionality, such as an external keyboard 1150 may also be provided. Mobile device case 1100 may thus not only perform cosmetic and protective functions of conventional mobile device cases, but also enhance performance and usability of mobile device 1102.

Thus, various embodiments of cooling structures, their components, and method of operations have been disclosed. Various features may be omitted and/or combined in ways not explicitly disclosed herein. As a result, cooling of heat-generating structures may be improved.

Figure 12:
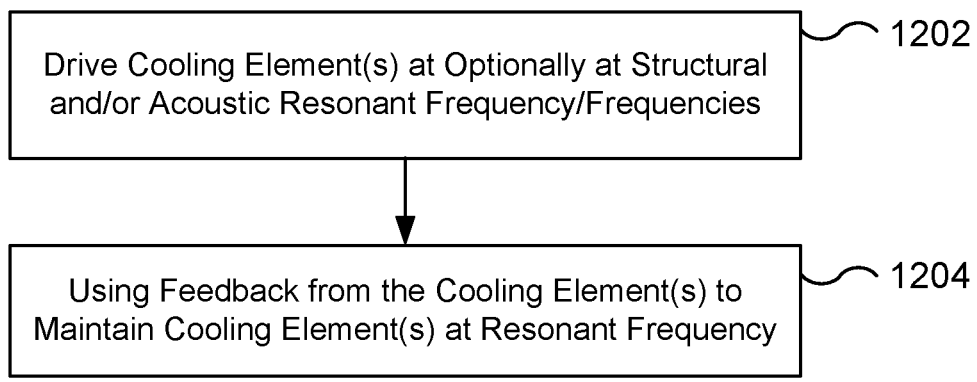
FIG. 12 is a flow chart depicting an exemplary embodiment of a method for operating a cooling system.

FIG. 12 is a flow chart depicting an exemplary embodiment of method 1200 for operating a cooling system. Method 1200 may include steps that are not depicted for simplicity. Method 1200 is described in the context of cooling systems 100, 710 and 720. However, method 1200 may be used with other cooling systems including but not limited to systems and cells described herein.

One or more of the cooling element(s) in a cooling system is actuated to vibrate, at 1202. At 1202, an electrical signal having the desired frequency is used to drive the cooling element(s). In some embodiments, the cooling elements are driven at or near structural and/or acoustic resonant frequencies at 1202. The driving frequency may be 15 kHz or higher. If multiple cooling elements are driven at 1202, the cooling elements may be driven out-of-phase. In some embodiments, the cooling elements are driven substantially at one hundred and eighty degrees out of phase. Further, in some embodiments, individual cooling elements are driven out-of-phase. For example, different portions of a cooling element may be driven to vibrate in opposite directions (i.e. analogous to a seesaw). In some embodiments, individual cooling elements may be driven in-phase (i.e. analogous to a butterfly). In addition, the drive signal may be provided to the anchor(s), the cooling element(s), or both the anchor(s) and the cooling element(s). Further, the anchor may be driven to bend and/or translate.

Feedback from the piezoelectric cooling element(s) is used to adjust the driving current, at 1204. In some embodiments, the adjustment is used to maintain the frequency at or near the acoustic and/or structural resonant frequency/frequencies of the cooling element(s) and/or cooling system. Resonant frequency of a particular cooling element may drift, for example due to changes in temperature. Adjustments made at 1204 allow the drift in resonant frequency to be accounted for.

For example, a cooling element, such as cooling element 120, in one or more of cooling cells 711 and/or 721 may be driven at its structural resonant frequency/frequencies, at 1202. This resonant frequency may also be at or near the acoustic resonant frequency for the top chamber (e.g. top chamber 140). This may be achieved by driving piezoelectric layer(s) in anchor 160 (not shown in FIGS. 1A-1F) and/or piezoelectric layer(s) in cooling element 120. Further, 1202 may be performed for all of cooling cells 711 and/or 721 or some of cooling cells 711 and/or 721. For example, if a portion of mobile device 702 closest to the upper left cooling cell 711 of cooling system 710 is a localized hot spot, then only this cooling cell might be driven. Alternatively, cooling elements in another number (including all) of cooling cells 711 and/or 721 may be driven at 1202. Multiple cooling cells 711 and/or 721 may be driven in-phase or out-of-phase at 1202. In addition, 1202 may be performed in response to various conditions being fulfilled. For example, a surface temperature of mobile device 702 reaching or exceeding a threshold, a temperature of a portion of housing 701 meeting or exceeding a threshold, an internal temperature of mobile device 702 reaching or exceeding a threshold, an input from mobile device 702, an input from a user, and/or another condition being fulfilled may result in cooling element(s) of cooling cell(s) 711 and/or 721 being energized.

At 1204, feedback is used to maintain the cooling element of cooling cell(s) 711 and/or 721 (e.g. cooling element 120) at resonance. In some embodiments in which multiple cooling elements are driven, the cooling elements phase is also maintained at 1204. For example, cooling elements may be driven and maintained at one hundred and eighty degrees out-of-phase. Thus, the efficiency of cooling elements in driving fluid flow through cooling systems 710 and/or 720 and onto the surface of heat-generating mobile device 702 may be maintained. In some embodiments, 1204 includes sampling the current through the cooling element(s) and/or the current through the anchor and adjusting the current to maintain resonance and low input power.

Consequently, cooling elements, such as cooling element(s) 120, 410 and 420 and cooling systems/cells 100, 400, 500, 501, 600, 601, 710, 711, 720, 721, 810, 811, 820, 821, 910, 911, 920, 921, 1010, 1011, 1020, 1021, 1110 and/or analogous active cooling systems may operate as described above. Method 1200 thus provides for use of active cooling systems described herein. Thus, active cooling systems may more efficiently and quietly cool heat-generating devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A mobile device case, comprising:
   a housing for retaining a mobile device; and
   an active cooling system integrated into the housing, the active cooling system configured to use vibrational motion to cool a surface of the mobile device, the active cooling system including an orifice plate having at least one orifice therein, a top plate having at least one vent therein, and a cooling element between the orifice plate and the top plate, the cooling element configured to undergo the vibrational motion when actuated to draw a fluid into the at least one vent, direct the fluid toward the orifice plate, and drive the fluid through the at least one orifice.

2. The mobile device case of claim 1, wherein a portion of the housing into which the active cooling system is integrated has a thickness not exceeding three millimeters.

3. The mobile device case of claim 1, wherein the cooling element includes a first side and a second side, the first side being distal to the mobile device and in communication with the fluid, the second side being proximal to the mobile device, the cooling element being configured to direct the fluid from the first side to the second side using the vibrational motion such that the fluid moves toward the surface of the mobile device.

4. The mobile device case of claim 3, wherein the orifice plate is disposed between the cooling element and the mobile device, the cooling element being actuated to drive the fluid through the at least one orifice, the fluid traveling from the at least one orifice toward the surface of the mobile device.

5. The mobile device case of claim 3, wherein the active cooling system further includes a support structure and wherein the cooling element is selected from a centrally anchored cooling element and an edge anchored cooling element, the centrally anchored cooling element having a central region and a perimeter, the centrally anchored cooling element being supported by the support structure at the central region, at least a portion of the perimeter being unpinned, the edge anchored cooling element having a central portion and an edge, the edge anchored cooling element being supported by the support structure at the edge and having at least one aperture therein.

6. The mobile device case of claim 1, wherein the active cooling system further includes:
   a plurality of cooling cells, each of the plurality of cooling cells including the cooling element having a first side and a second side, the first side being distal to the mobile device and in communication with the fluid, the second side being proximal to the mobile device, the cooling element being configured to direct the fluid from the first side to the second side using the vibrational motion such that the fluid moves toward the surface of the mobile device.

7. The mobile device case of claim 1, wherein the housing further includes:
   at least one depression, the active cooling system configured to fit within the at least one depression.

8. The mobile device case of claim 7, wherein the depression has a depth not exceeding two millimeters.

9. The mobile device case of claim 1, further comprising:
   a connector configured to be coupled with the mobile device such that the active cooling system is energized by the mobile device.

10. The mobile device case of claim 1, further comprising:
    a battery electrically connected to the active cooling system such that the active cooling system is energized by the battery.

11. The mobile device case of claim 1, wherein the mobile device is selected from a mobile phone, a laptop, a tablet computer, a notebook computer, and a smart phone.

12. The mobile device case of claim 1, wherein the active cooling system has a total height not more than two millimeters.

13. The mobile device of claim 1, wherein the active cooling system is configured to drive the fluid through the at least one orifice such that the fluid exiting the at least one orifice has a speed of at least thirty meters per second.

14. A mobile device case, comprising:
    a housing for retaining a mobile device, a portion of the housing into which an active cooling system is integrated having a thickness not exceeding three millimeters; and
    the active cooling system integrated into the housing, the active cooling system having a depth not exceeding two millimeters, the active cooling system configured to cool a surface of the mobile device, the active cooling system further including an orifice plate having at least one orifice therein, a top plate having at least one vent therein, and a cooling element in communication with a fluid, the cooling element being configured to use vibrational motion to direct the fluid to be incident on the surface of the mobile device, the cooling element being between the orifice plate and the top plate, the cooling element configured to undergo the vibrational motion when actuated to draw the fluid into the at least one vent, direct the fluid toward the orifice plate, and drive the fluid through the at least one orifice.

15. A method, comprising:
    driving a cooling element of an active cooling system at a frequency to induce a vibrational motion, the active cooling system being integrated into a housing of a mobile device case, the housing configured to retain a mobile device, the active cooling system including an orifice plate having at least one orifice therein, a top plate having at least one vent therein, and the cooling element between the orifice plate and the top plate, the cooling element configured to undergo the vibrational motion when driven at the frequency to draw a fluid into the at least one vent, direct the fluid toward the orifice plate, and drive the fluid through the at least one orifice.

16. The method of claim 15, wherein a portion of the housing into which the active cooling system is integrated has a thickness not exceeding three millimeters.

17. The method of claim 15, wherein the cooling element includes a first side and a second side, the first side being distal to the mobile device and in communication with the fluid, the second side being proximal to the mobile device, the cooling element being configured to direct the fluid from the first side to the second side using the vibrational motion such that the fluid moves toward a surface of the mobile device.

18. The method of claim 17, wherein the orifice plate is disposed between the cooling element and the mobile device, the cooling element being actuated to drive the fluid through the at least one orifice, the fluid traveling from the at least one orifice toward the surface of the mobile device.

19. The method of claim 17, wherein the active cooling system further includes a support structure and wherein the cooling element is selected from a centrally anchored cooling element and an edge anchored cooling element, the centrally anchored cooling element having a central region and a perimeter, the centrally anchored cooling element being supported by the support structure at the central region, at least a portion of the perimeter being unpinned, the edge anchored cooling element having a central portion and an edge, the edge anchored cooling element being supported by the support structure at the edge and having at least one aperture therein.

20. The method of claim 17, wherein the housing including a depression therein, the active cooling system configured to fit within the depression, the depression having a depth not exceeding two millimeters.

21. The method of claim 15, wherein the driving further includes:
   driving the cooling element at a structural resonance for a cooling element resonant frequency for the cooling element.

22. The method of claim 21, wherein the frequency further corresponds to an acoustic resonance.

\* \* \* \* \*

UNITED STATES PATENT AND TRADEMARK OFFICE
CERTIFICATE OF CORRECTION

PATENT NO. : 11,533,823 B2
APPLICATION NO. : 17/121607
DATED : December 20, 2022
INVENTOR(S) : Suryaprakash Ganti et al.

It is certified that error appears in the above-identified patent and that said Letters Patent is hereby corrected as shown below:

In the Specification

In Column 6, Line(s) 34, before "has", delete "z" and insert --, z,--, therefor.

Signed and Sealed this
Fifth Day of September, 2023

Katherine Kelly Vidal
*Director of the United States Patent and Trademark Office*